United States Patent
Li

(10) Patent No.: US 8,629,679 B2
(45) Date of Patent: Jan. 14, 2014

(54) CIRCUITS AND METHODS FOR MEASURING CELL VOLTAGES IN BATTERY PACKS

(75) Inventor: Guoxing Li, Sunnyvale, CA (US)

(73) Assignee: O2Micro, Inc., Santa Clara, CA (US)

( * ) Notice: Subject to any disclaimer, the term of this patent is extended or adjusted under 35 U.S.C. 154(b) by 609 days.

(21) Appl. No.: 12/955,604

(22) Filed: Nov. 29, 2010

(65) Prior Publication Data

US 2011/0074431 A1 Mar. 31, 2011

Related U.S. Application Data

(60) Provisional application No. 61/290,563, filed on Dec. 29, 2009.

(51) Int. Cl.
*H02J 7/00* (2006.01)

(52) U.S. Cl.
USPC ........... 324/426; 320/118; 320/119; 320/121; 320/123

(58) Field of Classification Search
USPC ................... 320/118, 119, 121, 123
See application file for complete search history.

(56) References Cited

U.S. PATENT DOCUMENTS

| | | | |
|---|---|---|---|
| 7,352,155 B2 | 4/2008 | Li et al. | |
| 7,417,405 B2 | 8/2008 | Carrier et al. | |
| 7,965,061 B2 | 6/2011 | Li et al. | |
| 7,999,554 B2 | 8/2011 | Bucur et al. | |
| 2002/0193955 A1 | 12/2002 | Bertness et al. | |
| 2003/0232237 A1 | 12/2003 | Nakagawa et al. | |
| 2008/0088277 A1* | 4/2008 | Wang et al. | 320/119 |
| 2010/0157495 A1 | 6/2010 | Densham | |
| 2010/0188046 A1 | 7/2010 | Liu et al. | |

FOREIGN PATENT DOCUMENTS

| | | |
|---|---|---|
| CN | 2914448 Y | 6/2007 |
| CN | 100463435 C | 2/2009 |
| CN | 101499671 A | 8/2009 |
| JP | 4340514 B2 | 10/2009 |
| TW | 200627746 A | 8/2006 |
| TW | 200822484 A | 5/2008 |
| TW | 200828725 A | 7/2008 |

* cited by examiner

*Primary Examiner* — Samuel Berhanu

(57) ABSTRACT

A circuit used to measure cell voltages in a battery pack can include a cell voltage level shifter, a sense block, and a compensation current generator. The cell voltage level shifter selects a cell and shifts the terminal voltages of the selected cell from a first voltage level to a second voltage level. The sense block monitors the current consumed by the level shifter, and generates a signal indicative of the consumed current. The compensation current generator generates compensation currents to compensate the current consumed by the level shifter. Therefore, unbalance of the cell capacities caused by the current consumed by the level shifter can be reduced or eliminated, and thus the overall capacity of the battery pack can be improved.

20 Claims, 8 Drawing Sheets

CIRCUITS AND METHODS FOR MEASURING CELL VOLTAGES IN BATTERY PACKS

RELATED APPLICATION

This application claims priority to U.S. Provisional Application No. 61/290,563, titled "CIRCUITS AND METHODS FOR MEASURING CELL VOLTAGES IN BATTERY PACKS", filed on Dec. 29, 2009, which is hereby incorporated by reference in its entirety.

BACKGROUND ART

Batteries can be used in various applications, such as electric vehicles and hybrid electric vehicles. The workable voltage of a single cell in a battery may be approximately 2~4 volts, but some systems such as the electric vehicles and the hybrid electric vehicles may require higher voltages, e.g., 40 volts. Multiple cells can be coupled to each other in series to drive the electric vehicles and the hybrid electric vehicles.

In battery management, the status of cells, such as cell voltages, may be detected and measured by a measurement block, e.g., an analog-to-digital converter (ADC). The ADC can be implemented by devices having relatively low voltages. A voltage level shifter can be coupled between the cells and the ADC to shift the terminal voltages of each cell to lower voltages, e.g., from 40 volts to 2 volts, and the ADC detects and measures the cell voltages according to the shifted voltages.

FIG. 1 shows a conventional cell voltage detection circuit 100. The circuit 100 includes a battery pack 110, a cell voltage level shifter 120, and a detection and measurement block 140. The battery pack 110 includes battery cells 111-115 as shown in the example of FIG. 1. The level shifter 120 selects a battery cell according to a cell selection signal 180, and shifts the terminal voltages of the selected cell to lower voltages. In such way, the detection and measurement block 140 can measure the cell voltages for the cells 111-115, and output the measured results accordingly.

The level shifter 120 consumes current from the battery pack 110. By way of example, when the cell 112 is selected, a current $I_{VH1}$ flows from the node H1 which is the positive terminal of the cell 112, through the level shifter 120, the cells 115-112, and back to the node H1. Moreover, a current $I_{VL1}$ flows from the node L1 which is the negative terminal of the cell 112, through the level shifter 120, the cells 115-113, and back to the node L1. Therefore, the capacities of the cells 113-115 are degraded by the currents $I_{VH1}$ and $I_{VL1}$, while the capacity of the cell 112 is degraded by the current $I_{VH1}$. Similarly, the level shifter 120 consumes current when measuring cell voltages for other cells, e.g., cells 111 and 113-115. As a result, the capacities of the cells 111-115 are unbalanced and the cell 115 located at the bottom of the battery 110 may have less capacity compared to other cells 111-114, thus affecting the available capacity of the battery pack 110.

SUMMARY

In one embodiment, a circuit used to measure cell voltages in a battery pack includes a cell voltage level shifter, a sense block, and a compensation current generator. The cell voltage level shifter selects a cell and shifts the terminal voltages of the selected cell from a first voltage level to a second voltage level. The sense block monitors the current consumed by the level shifter, and generates a signal indicative of the consumed current. The compensation current generator generates a compensation current to compensate the current consumed by the level shifter. Therefore, unbalance of the cell capacities caused by the current consumed by the level shifter can be reduced or eliminated, and thus the overall capacity of the battery pack can be improved.

BRIEF DESCRIPTION OF THE DRAWINGS

The accompanying drawings, which are incorporated in and form a part of this specification and in which like numerals depict like elements, illustrate embodiments of the present invention and, together with the description, serve to explain the principles of the invention.

DETAILED DESCRIPTION

Reference will now be made in detail to the embodiments of the present invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments in accordance with the present invention provide detection or measurement circuits for a battery pack. A detection circuit can include a level shifter. Advantageously, the detection circuit can monitor the current consumed by the level shifter and generate a corresponding compensation current to compensate the current consumed by the level shifter. As a result, unbalance of the cell capacities caused by the current consumed by the level shifter can be reduced or eliminated, and thus the overall capacity of the battery pack can be improved. The battery described in the present invention can be, but is not limited to, a Lithium Ion battery or a Lead Acid battery. Although the invention is described in relation to a battery, the invention is not so limited. For example, the invention may also be used in solar cell applications.

Figure 1:
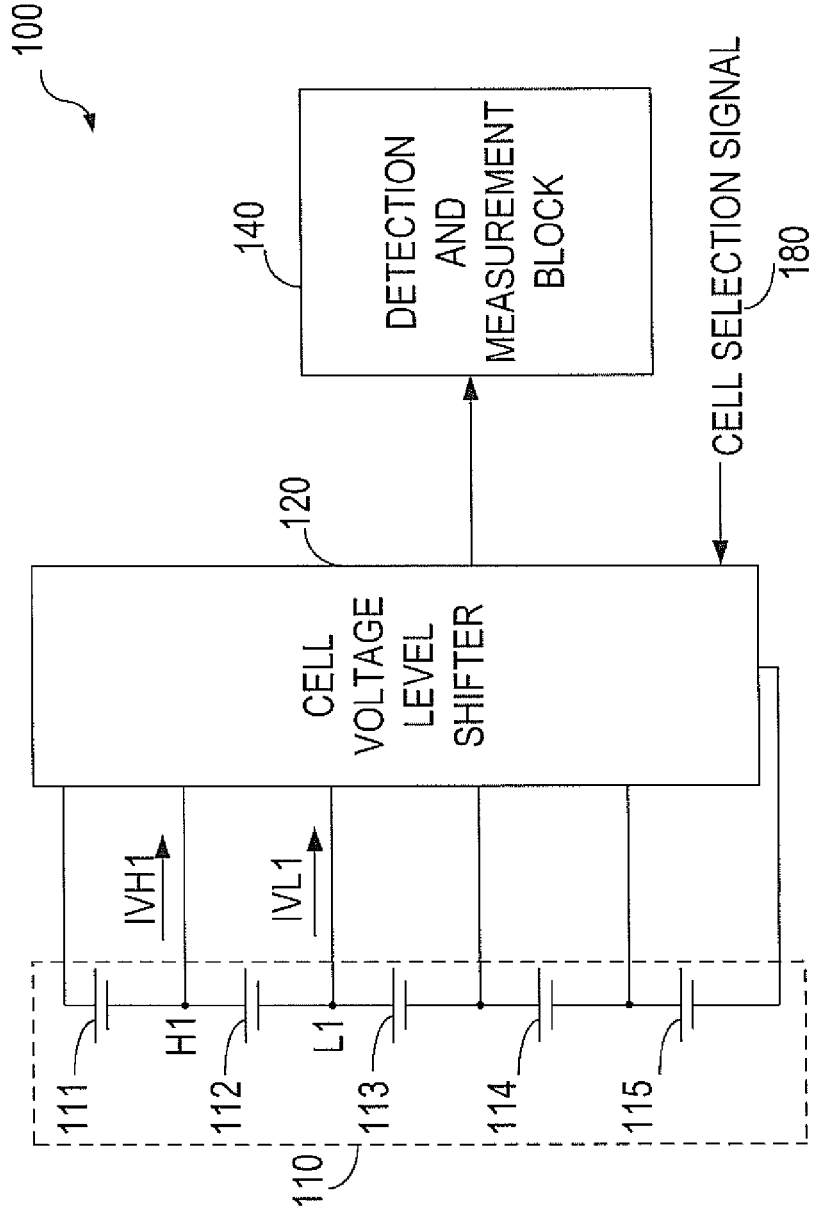
FIG. 1 shows a conventional cell voltage detection circuit for a battery pack.
Figure 2:
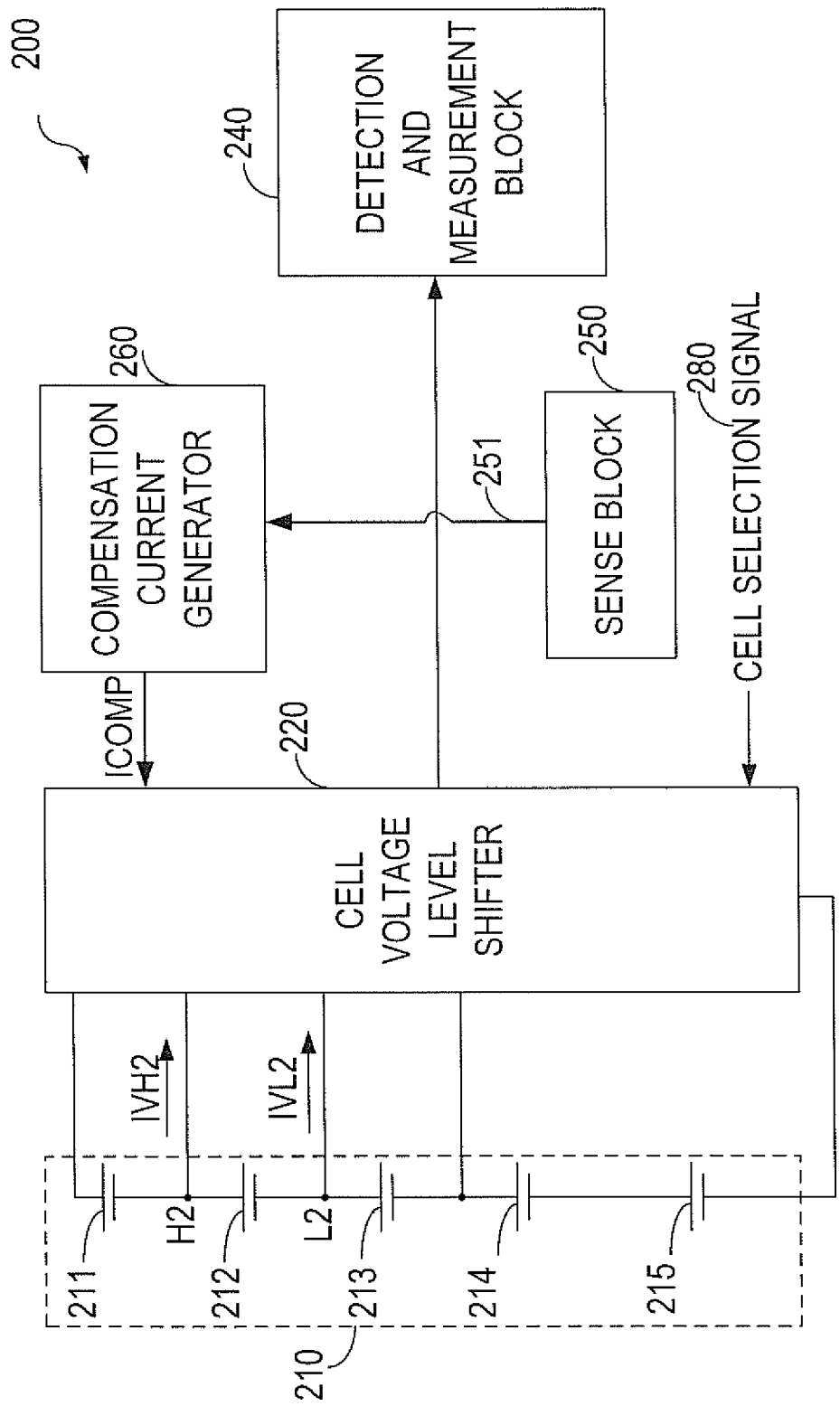
FIG. 2 illustrates a block diagram of a circuit for measuring cell voltages of a battery pack, in accordance with one embodiment of the present invention.

FIG. 2 illustrates a block diagram of a circuit 200 for measuring cell voltages of a battery pack, in accordance with one embodiment of the present invention. In the example of FIG. 2, the circuit 200 includes a battery pack 210, a cell voltage level shifter 220, a detection and measurement block 240, a sense block 250, and a compensation current generator 260. In the example of FIG. 2, the battery pack 210 includes cells 211-215 for illustration purposes but not limitation. The battery pack 210 can include some other number of battery cells.

The level shifter 220 is coupled to each cell in the battery pack 210 and can select a cell according to a cell selection signal 280 and shift the terminal voltages of the selected cell from a first voltage level to a second voltage level. In one embodiment, the first voltage level is higher than the second voltage level. In one embodiment, one cell is selected at each time. The detection and measurement block 240 receives the shifted voltages and measures the cell voltages of the cells 211-215.

When the level shifter 220 selects a cell to shift the terminal voltages of the selected cell, the level shifter 220 may consume currents from the terminals of the selected cell. The sense block 250 can monitor a current flowing through a terminal of the selected cell and can generate a sense signal 251 indicative of the current flowing from the terminal of the selected cell to the level shifter 220. For example, the sense block 250 can monitor a current IVH2 flowing from the terminal H2 of the cell 212 to the level shifter 220 and/or a current IVL2 flowing from the terminal L2 of the cell 212 to the level shifter 220. In one embodiment, the sense signal 251 is a sense current. The compensation current generator 260 receives the sense signal 251 and generates a compensation current $I_{COMP}$ according to the sense signal 251. For example, the compensation current generator 260 can generate the compensation current $I_{COMP}$ by mirroring and/or scaling the signal 251.

Advantageously, the compensation current $I_{COMP}$ can flow through the battery pack 210 to compensate the current consumed by the level shifter 220. Therefore, the unbalance of the cell capacities caused by the level shifter 220 can be reduced or avoided, and thus the lifetime of the battery pack 210 can be improved.

Figure 3:
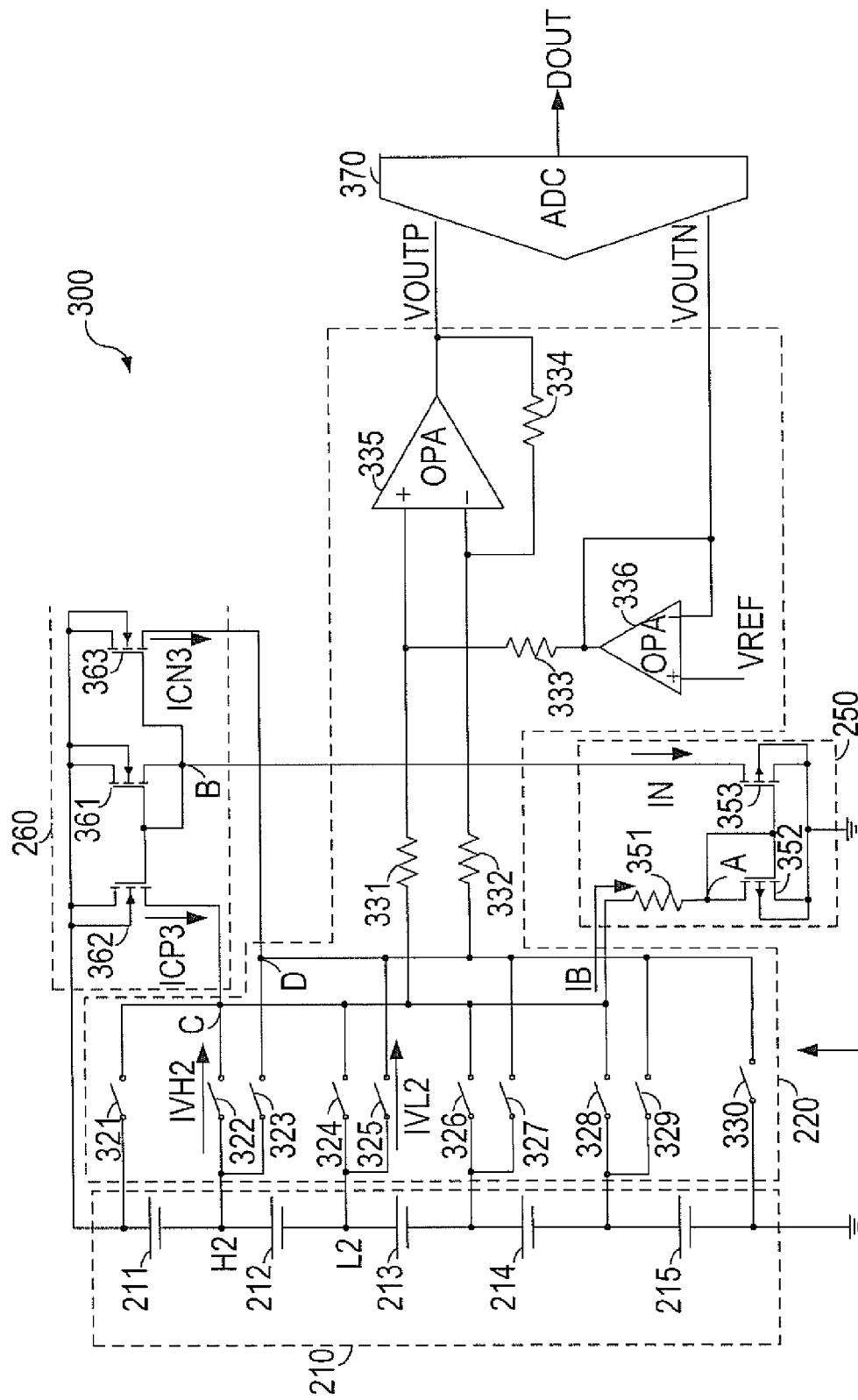
FIG. 3 shows a schematic diagram of a circuit for measuring cell voltages of a battery pack, in accordance with one embodiment of the present invention.

FIG. 3 shows a schematic diagram of a circuit 300 for measuring cell voltages of a battery pack, in accordance with one embodiment of the present invention. FIG. 3 is described in combination with FIG. 2.

In the example of FIG. 3, the level shifter 220 can include switches 321-330. The switches 321-330 can be controlled by a cell selection signal 280. In addition, the level shifter 220 includes two proportional amplifiers. One proportional amplifier includes resistors 332 and 334 and operational amplifier 335, and the other proportional amplifier includes operational amplifier 336. Moreover, the level shifter 220 further includes resistors 331 and 333. The switches 321, 322, 324, 326 and 328 are coupled to the positive terminal of the operational amplifier 335 via the resistor 331. The switches 323, 325, 327, 329 and 330 are coupled to the negative terminal of the operational amplifier 335 through the resistor 332. In one embodiment, the resistors 331 and 332 are identical, and the resistors 333 and 334 are identical. The level shifter 220 can shift the terminal voltages of a selected cell to voltages $V_{OUTP}$ and $V_{OUTN}$. The shifted voltages $V_{OUTP}$ and $V_{OUTN}$ are the outputs of the amplifier 335 and the amplifier 336, respectively.

By way of example, when the switches 322 and 325 are on, and the switches 321, 323-324 and 326-330 are off, the battery cell 212 is selected and the terminal voltages $V_{H2}$ and $V_{L2}$ of the cell 212 are received or sensed by the level shifter 220. The level shifter 220 shifts the terminal voltages $V_{H2}$ and $V_{L2}$ to the voltages $V_{OUTP}$ and $V_{OUTN}$ respectively. The difference $V_{OUT}$ between $V_{OUTP}$ and $V_{OUTN}$ can be given by:

$$V_{OUT}=V_{OUTP}-V_{OUTN}=(V_{H2}-V_{L2})\times R_B/R_A, \quad (1)$$

where $V_{H2}-V_{L2}$ is the cell voltage of the battery cell 212, $R_B$ is the resistance of the resistor 333 and the resistance of the resistor 334, $R_A$ is the resistance of the resistor 331 and the resistance of the resistor 332, $V_{H2}$ is the voltage at the node H2 which is the positive terminal of the cell 212, and $V_{L2}$ is the voltage at the node L2 which is the negative terminal of the cell 212. The ADC 370 converts the voltage $V_{OUT}$ to a digital signal $D_{OUT}$.

In the example of FIG. 3, the sense block 250 includes a resistor 351 and a current mirror including switches 352 and 353. The switches 352 and 353 can be N-channel metal-oxide-semiconductor field effect transistors (NMOSFETs) sinking/sourcing the sense current indicative of the current flowing from the terminal of the selected cell to the level shifter 220. One terminal of the resistor 351 receives one terminal voltage of the selected battery cell, and the other terminal of the resistor 351 receives the gate-source voltage of the switch 352 in the current mirror. For example, the width-to-length ratio of the NMOSFET 352 to the width-to-length ratio of the NMOSFET 353 can be 1:1. However, the invention is not so limited; the width-to-length ratio of the NMOSFET 352 to the width-to-length ratio of the NMOSFET 353 can be different from 1:1. The sense block 250 can monitor a current flowing through a terminal of the selected cell and can generate a sense signal 251 indicative of the current flowing from the terminal of the selected cell to the level shifter 220.

By way of example, when the switches 322 and 325 are on, and the switches 321, 323-324 and 326-330 are off, the battery cell 212 is selected. A current $I_{VH2}$ flowing from the node H2 (positive terminal of the cell 212) through the switch 322, the resistor 331 and resistor 333 can be given by:

$$I_{VH2}=(V_{H2}-V_{REF})/(R_A+R_B), \quad (2)$$

where $V_{REF}$ is a predetermined reference voltage. A current $I_{VL2}$ flowing from the node L2 (negative terminal of the cell 212) through the switch 325 and the resistors 332 and 334 can be given by:

$$I_{VL2}=I_{VH2}-(V_{H2}-V_{L2})/R_A. \quad (3)$$

In other words, the levels of the currents $I_{VH2}$ and $I_{VL2}$ consumed by the level shifter 220 are dependent on the reference voltage $V_{REF}$. A current flowing through the sense block 250, e.g., a bias current $I_B$, flowing through the resistor 351 and the NMOSFET 352 can be given by:

$$I_B \approx (V_{H2}-V_{GS})/R_C, \quad (4)$$

where $V_{GS}$ is the gate-source voltage of the NMOSFET 352 and $R_C$ is the resistance of the resistor 351. $R_A$, $R_B$ and $R_C$ meet the following equation:

$$R_C=K\times(R_A+R_B), \quad (5)$$

where K can be a constant indicating a proportional coefficient between $R_C$ and $(R_A+R_B)$. Assuming that the predetermined reference voltage $V_{REF}$ is substantially equal to $V_{GS}$ and by combining the equations (2), (3) and (4), the current $I_{VH2}$ can be given by:

$$I_{VH2}=K\times I_B. \quad (6)$$

Here the term "substantially equal" is used because some difference between the predetermined reference voltage $V_{REF}$ and the gate-source voltage $V_{GS}$ of the NMOSFET 352 is permitted; however, that difference is small enough to be ignored. Advantageously, the sense block 250 can sense the current $I_{VH2}$ and can generate a sensing current $I_N$ indicative of the current $I_{VH2}$ to the compensation current generator 260. In one embodiment, the sensing current $I_N$ can be equal to the current $I_B$. Thus, the following equation can be obtained:

$$I_N = I_{VH2}/K. \quad (7)$$

In the example of FIG. 3, the compensation current generator 260 can be a current mirror including P-channel metal-oxide-semiconductor field effect transistors (PMOSFETs) 361, 362 and 363 sinking/sourcing the sense current and the compensation current. The width-to-length ratios of the PMOSFETs 361, 362 and 363 can have the proportion 1:(K+1):K. In one embodiment, the compensation current generator 260 receives the sensing current $I_N$ from the sense block 250, and generates compensation currents $I_{CN3}$ and $I_{CP3}$ flowing into the battery pack 210 to compensate the current consumed by the level shifter 220.

By way of example, when the switches 322 and 325 are on, and the switches 321, 323-324 and 326-330 are off, the battery cell 212 is selected. The sensing current $I_N$ flows through the PMOSFET 361. Thus, a current $I_{CP3}$ flowing through the PMOSFET 362, the switch 322 and the cells 212-215 can be given by:

$$I_{CP3} = (K+1) \times I_N = I_{VH2} + I_B. \quad (8)$$

The current $I_{CN3}$ flowing through the PMOSFET 363, the switch 325 and the cells 213-215 can be given by:

$$I_{CN3} = K \times I_N = I_{VH2}. \quad (9)$$

Advantageously, the compensation current $I_{CP3}$, which is substantially equal to $I_{VH2}+I_B$, flows through the cells 212-215 in the opposite direction of the currents $I_{VH2}$ and $I_B$. Here the term "substantially equal" is used because some difference between the compensation current $I_{CP3}$ and the current $I_{VH2}+I_B$ is permitted; however, that difference is small enough to be ignored. In other words, the currents $I_{VH2}$ and $I_B$ can be compensated by the compensation current $I_{CP3}$. Therefore, the capacity degradation of the cells 212-215 caused by the current $I_{VH2}$ can be reduced or eliminated by the compensation current $I_{CP3}$. Moreover, the compensation current $I_{CN3}$ (given by equation (9)) flows through the cells 213-215 in the opposite direction of the current $I_{VL2}$. In one embodiment, the difference between the compensation current $I_{CN3}$ and the current $I_{VL2}$ is small enough to be ignored and can be given by:

$$I_{CN3D} = I_{CN3} - I_{VL2} = I_{VH2} - I_{VL2} = (V_{H2} - V_{L2})/R_A. \quad (10)$$

Therefore, the capacity degradation of the cells 213-215 caused by the current $I_{VL2}$ can be reduced by the compensation current $I_{CN3}$.

Similarly, when the cell 211, 213 or 214 is selected, the sense block 250 can sense the current consumed by the level shifter 220 and the compensation current generator 260 can generate a compensation current to compensate the current consumed by the level shifter 220. In one embodiment, when the cell 215 is selected, the level shifter 220 does not consume current from the negative terminal of the cell 215 (ground), and thus no compensation current flows into the negative terminal of the cell 215 and the current flowing from the PMOSFET 363 can flow into ground. The current flowing from the PMOSFET 362 compensates the consumed current flowing from the positive terminal of the cell 215.

Furthermore, since the impedance at each cell terminal is relatively low, and the impedances at the outputs of the current mirrors (e.g., nodes A, B, C and D) and the inputs of the level shifter (e.g., nodes C and D) are relatively high, the sense block 250 and the compensation current generator 260 can still maintain relatively high accuracy even if there are some slight differences between the current consumed by the level shifter 220 and the compensation current generated by the compensation current generator 260.

Figure 4:
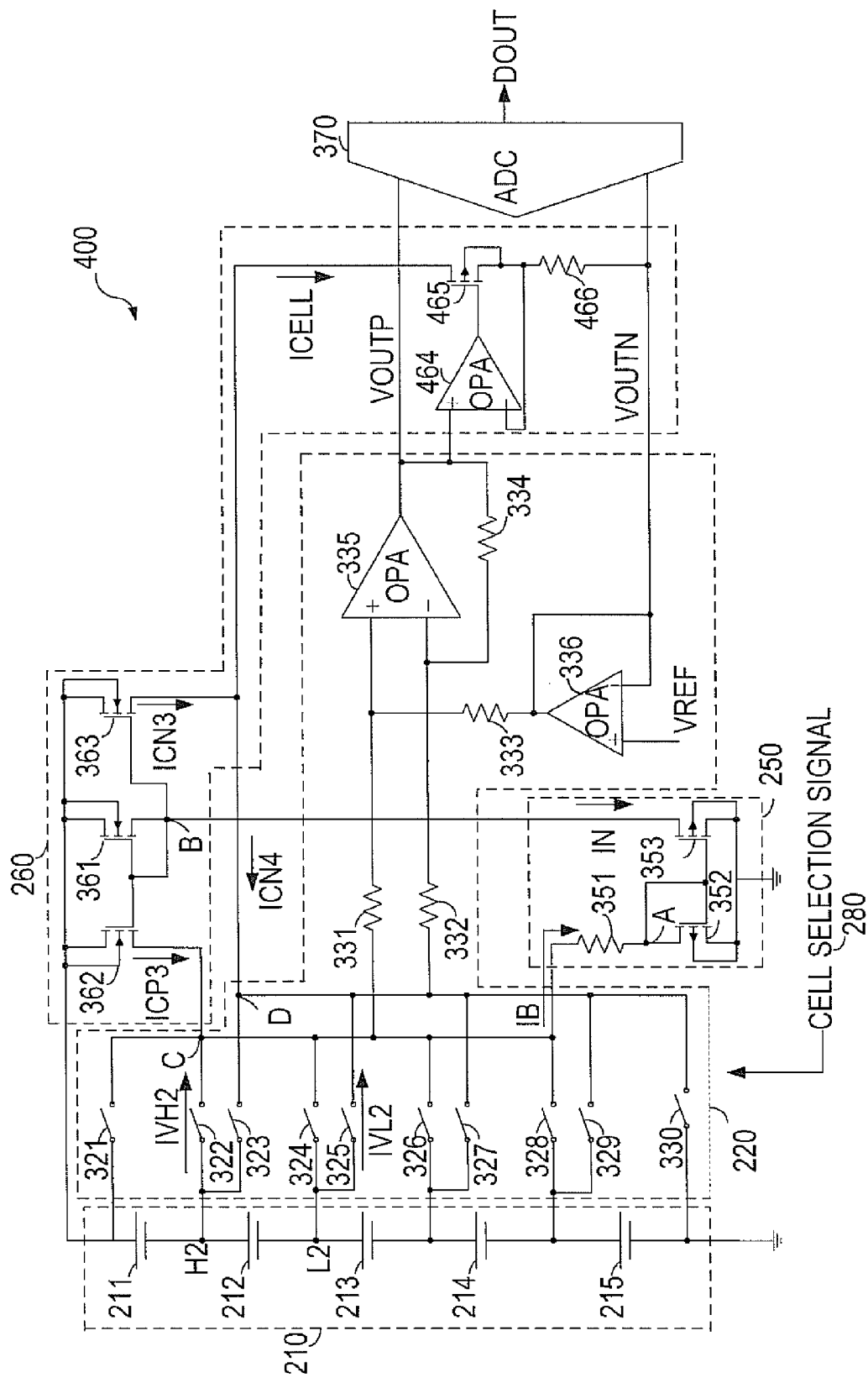
FIG. 4 shows a schematic diagram of a circuit for measuring cell voltages of a battery pack, in accordance with another embodiment of the present invention.

FIG. 4 shows a schematic diagram of a circuit 400 for measuring cell voltages of a battery pack, in accordance with another embodiment of the present invention. FIG. 4 is described in combination with FIG. 3.

In the example of FIG. 4, besides the current mirror including the PMOSFETs 361, 362 and 363, the compensation current generator 260 can further include a resistor 466 having the resistance $R_B$ and a voltage follower including an operational amplifier 464 and an NMOSFET 465. In one embodiment, when the switches 322 and 325 are on, and the switches 321, 323-324 and 326-330 are off, the current $I_{CP3}$ compensates the current $I_{VH2}+I_B$ in a similar way as in the example in FIG. 3, while a current $I_{CN4}$ flowing through the switch 325 and the cells 213-215 compensates the current $I_{VL2}$. The current $I_{CN4}$ can be given by:

$$I_{CN4} = I_{CN3} - I_{CELL}, \quad (11)$$

where $I_{CELL}$ can be a current flowing through the NMOSFET 465 and the resistor 466, in one embodiment. By combining the equation (1), the current $I_{CELL}$ can be given by:

$$I_{CELL} = (V_{OUTP} - V_{OUTN})/R_B = (V_{H2} - V_{L2})/R_A. \quad (12)$$

Thus, by combining the equations (3), (9), (11) and (12), the following equation can be obtained:

$$I_{CN4} = I_{VH2} - (V_{H2} - V_{L2})/R_A = I_{VL2}. \quad (13)$$

Advantageously, the current $I_{VL2}$ can be compensated by the current $I_{CN4}$ having the same level as the current $I_{VL2}$. Therefore, the capacity degradation of the cells 213-215 caused by the current $I_{VL2}$ can be reduced or eliminated by the compensation current $I_{CN4}$.

Figure 5:
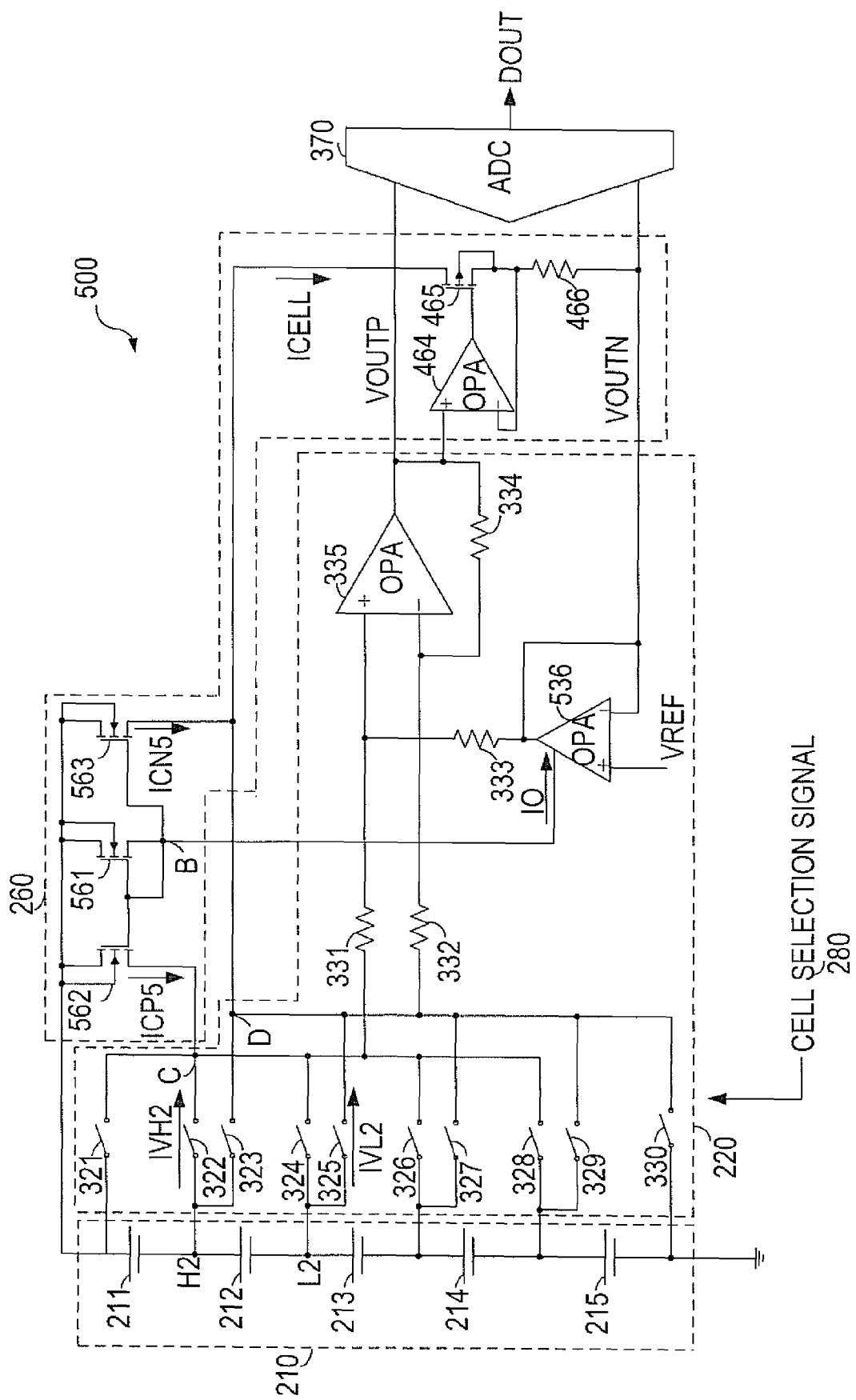
FIG. 5 shows a schematic diagram of a circuit for measuring cell voltages of a battery pack, in accordance with another embodiment of the present invention.

FIG. 5 shows a schematic diagram of a circuit 500 for measuring cell voltages of a battery pack, in accordance with another embodiment of the present invention. FIG. 5 is described in combination with FIG. 4.

In the example of FIG. 5, the resistors 331 and 333 and an amplifier 536 included in the level shifter 220 can serve as the sense block 250 to generate a current $I_O$ indicative of the current consumed by the level shifter 220. In one embodiment, the current $I_O$ can meet the following equation:

$$I_O = I_{VH2}/K. \quad (14)$$

The compensation current generator 260 can include PMOSFETs 561, 562 and 563. In one embodiment, the width-to-length ratios of the PMOSFETs 561, 562 and 563 can meet the proportion 1:K:K. Therefore, both compensation currents $I_{CP5}$ flowing through the PMOSFET 562 and $I_{CN5}$ flowing through the PMOSFET 563 are equal to $I_{VH2}$. In such way, the current $I_{CP5}$ compensates the current $I_{VH2}$, and the current $I_{CN5}-I_{CELL}$ compensates the current $I_{VL2}$. Advantageously, the circuit in the example of FIG. 5 can compensate the consumed currents without dependence on the gate-source voltage of the NMOSFET 352 in the example of FIG. 4. Moreover, the circuit in the example of FIG. 5 removes the resistor 351 in the example of FIG. 4, and thus further reduces the cost of the circuit.

Figure 6:
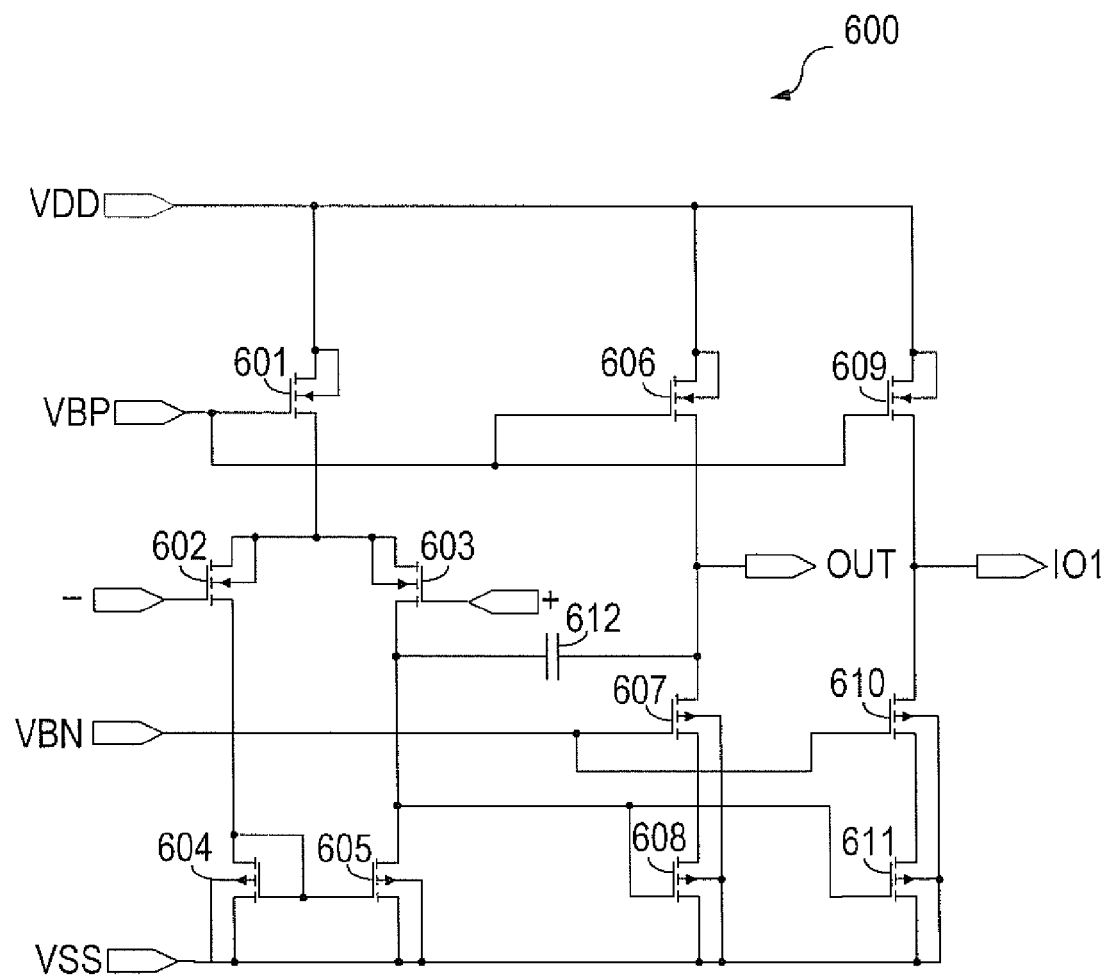
FIG. 6 shows an operational amplifier, in accordance with one embodiment of the present invention.

FIG. 6 shows an embodiment of an operational amplifier 600 which can be used as the operational amplifier 536 shown in FIG. 5. FIG. 6 is described in combination with FIG. 5. In the example of FIG. 6, the width-to-length ratio of a PMOSFET 606 to the width-to-length ratio of a PMOSFET 609 can be 1:1. However, the invention is not so limited; the width-to-length ratio of the PMOSFET 606 to the width-to-length ratio of the PMOSFET 609 can be different from 1:1. The width-to-length ratio of a NMOSFET 607 to the width-to-length ratio of a NMOSFET 610 can be K:1, and the width-to-length ratio of a NMOSFET 608 to the width-to-length ratio of a NMOSFET 611 can also be K:1.

The amplifier 600 can be used as the amplifier 536 in FIG. 5 and provide a current $I_{O1}$. In one embodiment, since the total resistance of the resistor 331 and the resistor 333 in the example of FIG. 5 is relatively low compared to the on resistance of the PMOSFETs 606 and 609, the difference between the current flowing through the resistor 331 and the resistor 333 and the current flowing through the NMOSFETs 607 and 608 can be ignored. In other words, the current flowing through the NMOSFETs 607 and 608 is approximately equal to $I_{VH2}$. Accordingly, the current $I_{O1}$ can be approximately equal to $I_{VH2}/K$.

Figure 7:
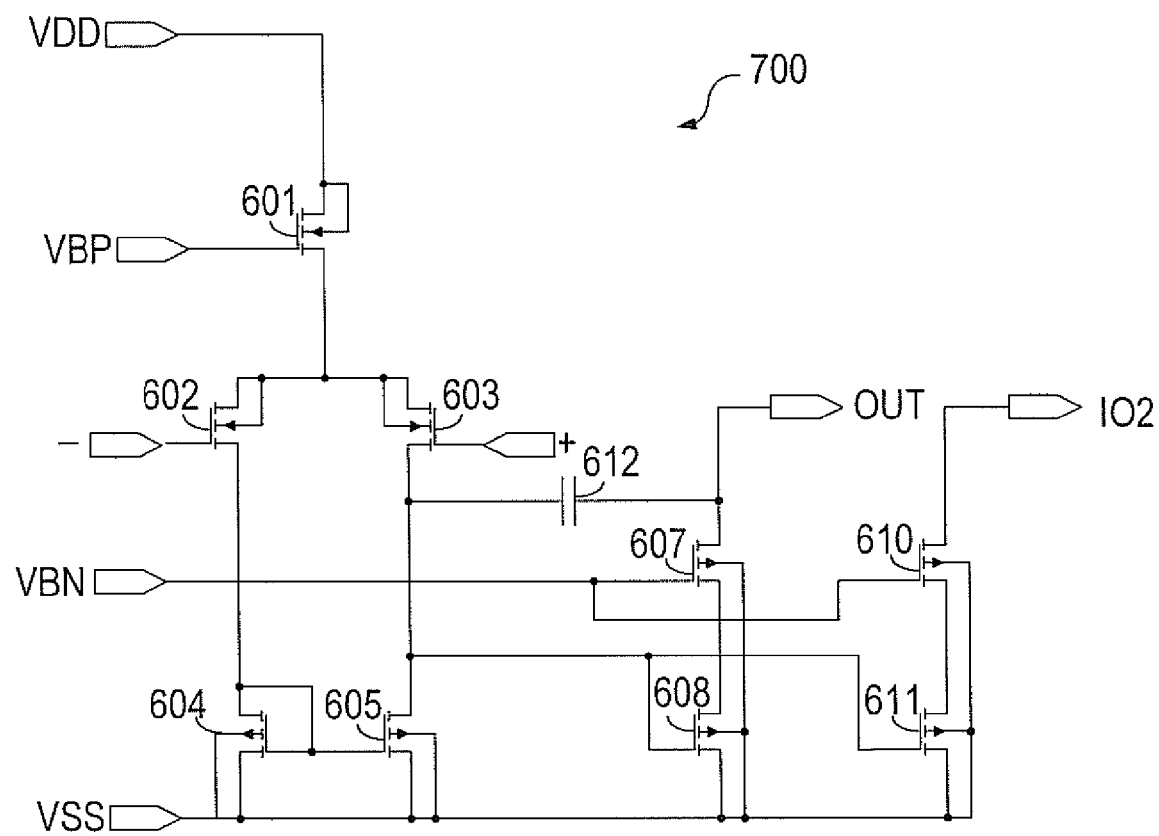
FIG. 7 shows an operational amplifier, in accordance with another embodiment of the present invention.

FIG. 7 shows another embodiment of an operational amplifier 700 which can be used as the operational amplifier 536 shown in FIG. 5. FIG. 7 is described in combination with FIG. 5 and FIG. 6.

Compared to the amplifier 600 in FIG. 6, the PMOSFETs 606 and 609 in FIG. 6 are removed from the amplifier 700 in FIG. 7. Therefore, the current flowing through the resistors 331 and 333 flows through the NMOSFETs 607 and 608. Advantageously, the current $I_{O2}$ generated by the amplifier 700 can follow the current $I_{VH2}$ with the proportion $1/K$ more accurately.

Figure 8:
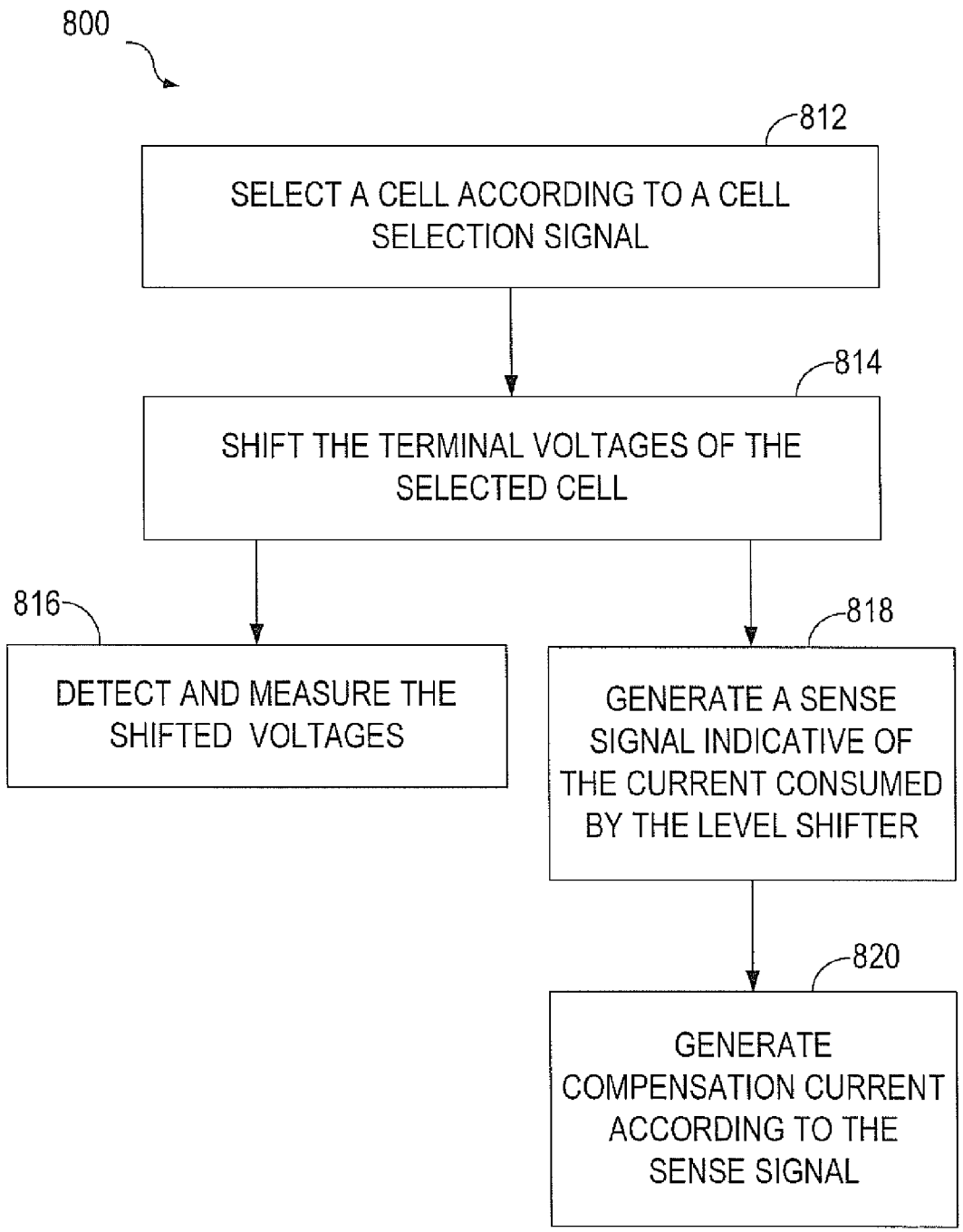
FIG. 8 shows a flowchart of a method for measuring cell voltages of a battery pack, in accordance with one embodiment of the present invention.

FIG. 8 illustrates a flowchart of a method 800 for measuring cell voltages of a battery pack. FIG. 8 is described in combination with FIG. 2. Although specific steps are disclosed in FIG. 8, such steps are examples. That is, the present invention is well suited to performing various other steps or variations of the steps recited in FIG. 8.

At step 812, a cell in a battery pack is selected to detect or measure the cell voltage of the selected cell. For example, the level shifter 220 selects a cell in the battery pack 210 according to a cell selection signal. At step 814, the terminal voltages of the selected cell are shifted from a first voltage level to a second voltage level. At step 816, the second voltage level is detected and measured.

At step 818, the current consumed during the shifting is monitored, and a sense signal indicative of the consumed current is generated. In one embodiment, the sense signal is proportional to the current consumed. At step 820, the compensation current flowing through the battery pack 210 to compensate the current consumed is generated according to the sense signal. In one embodiment, the compensation current is substantially equal to the current consumed. Here the term "substantially equal" is used because some difference between the compensation current and the current consumed is permitted; however, that difference is small enough to be ignored. Generally speaking, any amount of compensation of the current consumed is beneficial; ideally, the compensation current matches the current consumed. In one embodiment, the compensation current is generated further according to the second voltage level of the terminal voltage of the selected cell. Advantageously, the compensation current can have substantially the same level as the current consumed by the level shifter 220. Therefore, unbalance of the cell capacities caused by the current consumed by the level shifter can be reduced or eliminated, and thus the overall capacity of the battery pack can be improved.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A circuit for reduced power consumption management of a rechargeable multi-cell battery pack, comprising:
    a level shifter operable for shifting a terminal voltage of a battery cell from a first voltage level to a second voltage level;
    a sense block coupled to said level shifter operable for monitoring the current consumed by said level shifter from said battery cell and for generating a sense signal indicative of said current;
    a compensation current generator coupled to said sense block and said level shifter and operable for receiving said sense signal and generating a compensation current flowing into said battery cell according to said sense signal.

2. The circuit of claim 1, wherein said compensation current generator comprises current mirrors operable for sinking or sourcing said compensation current.

3. The circuit of claim 1, wherein said compensation current generator further generates said compensation current according to the cell voltage of said battery cell.

4. The circuit of claim 3, wherein said compensation current generator comprises:
    a voltage follower operable for receiving a voltage signal indicative of one terminal voltage of said battery cell; and
    a resistor with one terminal coupled to said voltage follower and the other terminal operable for receiving a voltage indicative of the other terminal voltage of said battery cell.

5. The circuit of claim 1, wherein said level shifter comprises a proportional amplifier.

6. The circuit of claim 1, wherein said sense signal is proportional to said current consumed by said level shifter.

7. The circuit of claim 1, wherein said sense signal is a sense current, and wherein said sense block comprises an amplifier operable for sinking or sourcing said current consumed by said level shifter and for providing said sense current.

8. The circuit of claim 1, wherein said sense signal is a sense current, and wherein said sense block comprises a current mirror operable for sinking or sourcing said current consumed by said level shifter and said sense current.

9. The circuit of claim 8, wherein said sense block further comprises a resistor with one terminal receiving said terminal voltage of said battery cell and the other terminal receiving the gate-source voltage of a switch in said current mirror; wherein said current consumed by said level shifter is dependent on a reference voltage; and wherein said gate-source voltage is substantially equal to said reference voltage.

10. The circuit of claim 1, wherein said first voltage level is higher than said second voltage level.

11. The circuit of claim 1, wherein said battery cell is selected according to a cell selection signal.

12. The circuit of claim 1, further comprising a detection and measurement block coupled to said level shifter and operable for detecting and measuring said second voltage level.

13. An apparatus for reduced power consumption management of a rechargeable multi-cell battery pack, comprising:
a plurality of battery cells coupled in series, wherein a battery cell is selected according to a cell selection signal and wherein a voltage of a terminal of said selected battery cell is shifted from a first voltage level to a second voltage level; wherein a consumed current flowing out of said selected battery cell terminal is sensed; and wherein a compensation current is provided into said selected battery cell terminal, wherein said compensation current corresponds in size to said consumed current.

14. The apparatus of claim 13, wherein a sense signal is generated according to said consumed current and said compensation current is generated according to said sense signal.

15. The apparatus of claim 13, wherein said compensation current flows from a current mirror.

16. The apparatus of claim 14, wherein said sense signal is an output signal of an amplifier.

17. A method for compensating currents for reduced power consumption management of a battery pack comprising a rechargeable multi-cell battery pack, said method comprising:
selecting a battery cell in said battery pack to shift;
shifting the terminal voltage of said battery cell from a first voltage level to a second voltage level;
monitoring current consumed from said battery pack as a result of shifting said terminal voltage from said first voltage level to said second voltage level;
generating a sense signal indicative of said current consumed because of said shifting; and
generating a compensation current according to said sense signal, said compensation current flowing into said battery pack.

18. The method of claim 17, wherein said method further comprises:
detecting said second voltage level.

19. The method of claim 17, wherein said sense signal is a sense current, and wherein said generating said compensation current comprises mirroring said sense current.

20. The method of claim 17, further comprising:
generating said compensation current according to the cell voltage of said battery cell.

* * * * *